(12) United States Patent
Onobuchi et al.

(10) Patent No.: US 8,885,988 B2
(45) Date of Patent: Nov. 11, 2014

(54) OPTICAL MODULE

(75) Inventors: Seigo Onobuchi, Kanagawa-ken (JP); Kosuke Sumi, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 845 days.

(21) Appl. No.: 13/024,473

(22) Filed: Feb. 10, 2011

(65) Prior Publication Data

US 2012/0025704 A1  Feb. 2, 2012

(30) Foreign Application Priority Data

Jul. 27, 2010  (JP) ................................. 2010-168486

(51) Int. Cl.
  *G02B 6/43*    (2006.01)
  *H01L 25/16*   (2006.01)
  *H01L 33/62*   (2010.01)

(52) U.S. Cl.
  CPC .............. *H01L 25/167* (2013.01); *H01L 33/62* (2013.01); *H01L 2924/19107* (2013.01); *H01L 2224/48247* (2013.01); *H01L 2224/45144* (2013.01)
  USPC .................... 385/14; 385/33; 385/59; 385/88; 385/92; 315/32; 315/291; 315/307

(58) Field of Classification Search
  USPC ............ 315/32, 291, 307; 385/14, 33, 59, 88, 385/92
  See application file for complete search history.

(56) References Cited

U.S. PATENT DOCUMENTS

| | | | |
|---|---|---|---|
| 6,758,607 B2 * | 7/2004 | Nakabayashi et al. | 385/88 |
| 7,484,897 B2 * | 2/2009 | Ono et al. | 385/53 |
| 2011/0235974 A1 * | 9/2011 | Tay et al. | 385/39 |

FOREIGN PATENT DOCUMENTS

JP        2004-357158        12/2004

\* cited by examiner

*Primary Examiner* — Douglas W Owens
*Assistant Examiner* — Thai Pham
(74) *Attorney, Agent, or Firm* — White & Case LLP

(57) ABSTRACT

According to one embodiment, an optical module includes a light emitting device, a driver IC, a first lead, a ground lead, a second lead, an input lead, and a power supply voltage lead. A second electrode of the light emitting device is supplied with a voltage on a ground side from a second pad through the first lead. A first electrode is supplied with a voltage on a power supply side from the power supply voltage lead or from a first pad through the second lead.

20 Claims, 7 Drawing Sheets

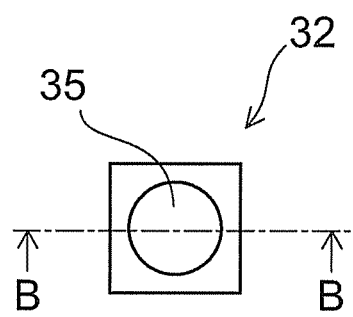 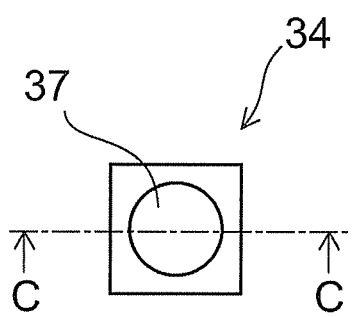
FIG. 2A        FIG. 2C
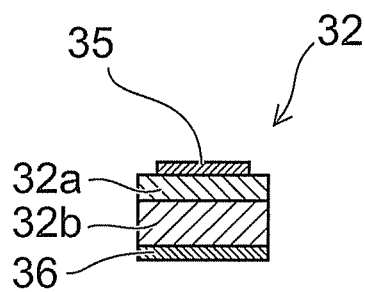 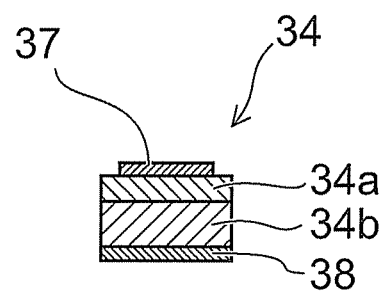
FIG. 2B        FIG. 2D

_US 8,885,988 B2_

OPTICAL MODULE

CROSS-REFERENCE TO RELATED APPLICATIONS

This application is based upon and claims the benefit of priority from the prior Japanese Patent Application No. 2010-168486, filed on Jul. 27, 2010; the entire contents of which are incorporated herein by reference.

FIELD

Embodiments described herein relate generally to an optical module.

BACKGROUND

If optical fibers are used as signal transmission cable, data transmission between information equipments, data transmission between industrial equipments, connection between audio equipments, communication in trunk lines and branch lines, and the like are possible.

Optical fiber transmission can speed up electro-optical modulation with simple circuits and increase transmission capacity. Furthermore, optical fiber transmission has such features as being able to reduce generation of electromagnetic noise and resistant to the influence of electromagnetic noise.

In the case of a short haul transmission, plastic optical fibers, plastic cladding silica fibers, and the like can be used. In the plastic optical fiber, both the core and the cladding are made of plastic. The transmission loss of the plastic optical fiber is minimized in the wavelength range near generally 650 nm. On the other hand, in the plastic cladding silica fiber, the core is made of quartz glass, and the cladding is made of plastic. The transmission loss of the plastic cladding silica fiber is minimized in the wavelength range near generally 800 nm. To use each optical fiber near the minimum transmission loss, the light emitting layers need to be made of different materials to vary the emission wavelength.

In this context, as the conductivity type of the substrate of the light emitting device, both p-type and n-type are often used. Furthermore, use of a driver IC for rapid modulation in the light emitting device facilitates reducing noise and downsizing the module. However, if the shape of the lead frame is changed to support the substrates of light emitting devices having different conductivity types, the number of models of packaging members increases undesirably.

BRIEF DESCRIPTION OF THE DRAWINGS

FIG. 2A is a schematic plan view of a light emitting device including an n-type substrate, FIG. 2B is a schematic cross-sectional view thereof, FIG. 2C is a schematic plan view of a light emitting device including a p-type substrate, and FIG. 2D is a schematic cross-sectional view thereof;

DETAILED DESCRIPTION

In general, according to one embodiment, an optical module includes a light emitting device, a driver IC, a first lead, a ground lead, a second lead, an input lead, and a power supply voltage lead. The light emitting device includes a substrate, a laminated body including a light emitting layer and provided on the substrate, a second electrode provided on a rear surface of the substrate, and a first electrode provided on the laminated body. The driver IC includes a power supply voltage pad, an input pad, a first pad capable of supplying a voltage on power supply side, and a second pad capable of supplying a voltage on ground side. The second electrode of the light emitting device is bonded to the first lead. The ground lead is connected to ground of the driver IC. The second lead is provided adjacent to the first lead and the ground lead. The input lead is connected to the input pad and operable to be inputted with a pulse signal. The power supply voltage lead is connected to the power supply voltage pad. The second electrode is supplied with the voltage on the ground side from the second pad through the first lead. The first electrode is supplied with the voltage on the power supply side from the power supply voltage lead or from the first pad through the second lead.

Embodiments of the invention will now be described with reference to the drawings.

Figure 1A:
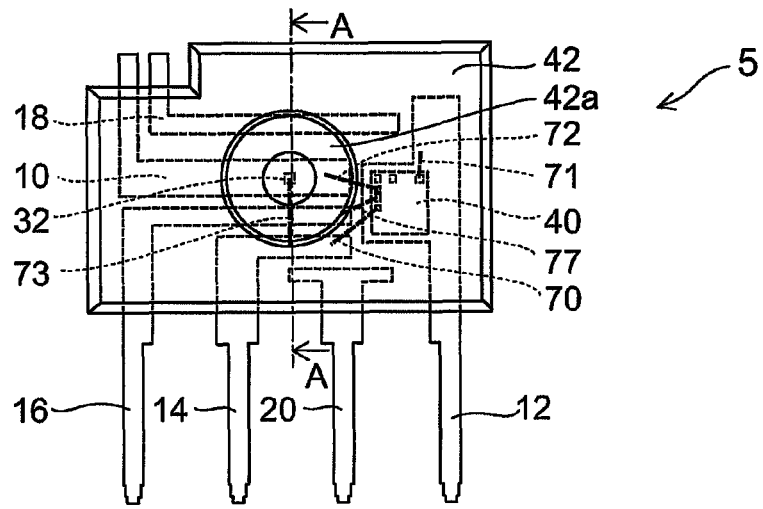
FIGS. 1A and 1B are schematic plan views of an optical module according to a first embodiment.
Figure 1B:
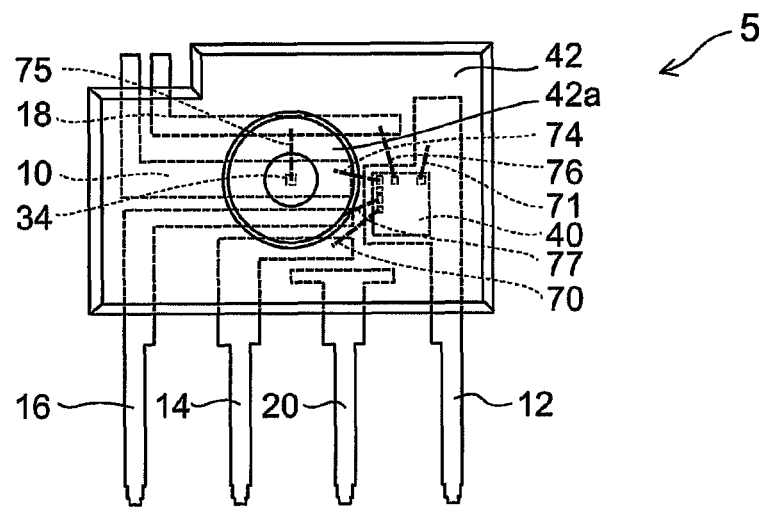
Figure 1C:
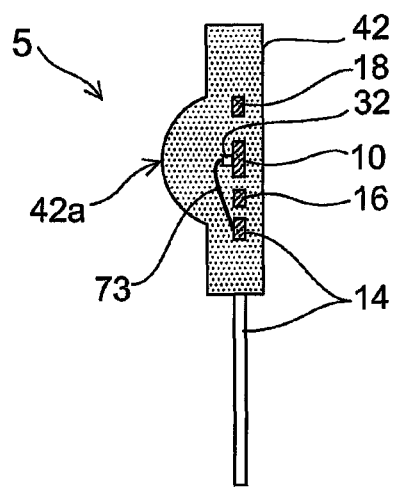
FIG. 1C is a schematic cross-sectional view thereof.

FIGS. 1A and 1B are schematic plan views of an optical module according to an embodiment of the invention. FIG. 1C is a schematic cross-sectional view taken along line A-A. The optical module 5 includes a light emitting device, a driver IC, leads, and a transparent resin molding.

The light emitting device 32, 34 includes a substrate, a laminated body provided on the substrate, a second electrode provided on the rear surface of the substrate, and a first electrode provided on the laminated body.

The leads include a first lead 10 with the light emitting device 32, 34 mounted thereon, a ground lead 12 with the driver IC 40 mounted thereon, a second lead 18 provided adjacent to the first lead 10 and the ground lead 12, a power supply voltage lead 14, and an input lead 16 to be inputted with signals. These leads are cut from a multi-piece lead frame. The lead frame is made of a copper-based alloy, an iron-based alloy, or the like. Its thickness can be set in the range of 0.15 to 0.3 mm or the like.

The transparent resin molding 42 serves as a support for supporting the leads. The transparent resin molding 42 covers the light emitting device 32, 34, the driver IC 40, the first lead 10, the second lead 18, one end portion of the ground lead 12, one end portion of the input lead 16, and one end portion of the power supply voltage lead 14. As shown in FIG. 1C, a converging lens 42a can be formed on the upper surface of the light emitting device 32, 34 to allow emission light to be efficiently incident on the optical fiber. Here, the "transparent resin" includes materials capable of transmitting emission light from the light emitting device, such as silicone, acrylic, and epoxy. In this context, the material may have absorption as long as it can transmit emission light.

FIG. 2A is a schematic plan view of a light emitting device including an n-type substrate. FIG. 2B is a schematic cross-sectional view taken along line B-B. FIG. 2C is a schematic plan view of a light emitting device including a p-type substrate. FIG. 2D is a schematic cross-sectional view taken along line C-C.

In FIGS. 2A and 2B, a laminated body 32a including an n-type layer, a light emitting layer, and a p-type layer is formed on an n-type substrate 32b by, for instance, the MOCVD (Metal Organic Chemical Vapor Deposition) method, the MBE (Molecular Beam Epitaxy) method, or the like. The p-type and n-type layers include a cladding layer and the like. On the p-type layer, a first electrode 35 including Au and having a circular or rectangular shape is provided. The diameter of the circle or one side of the rectangle can be set to 100 to 150 μm or the like. On the rear surface of the substrate 32b, a second electrode 36 is provided. The second electrode 36 is bonded to the lead frame with metal solder or conductive adhesive.

In FIGS. 2C and 2D, a laminated body 34a including a p-type layer, a light emitting layer, and an n-type layer is formed on a p-type substrate 34b by, for instance, the MOCVD method, the MBE method, or the like. A first electrode 37 is provided on the n-type layer, and a second electrode 38 is provided on the rear surface of the substrate 34b.

The substrate 32b, 34b can be made of, for instance, GaAs, or the like. In the case where the light emitting layer of the laminated body 32a, 34a is made of $In_x(Al_yGa_{1-y})_{1-x}P$ (0≤x≤1, 0≤y≤1), the wavelength range of emission light can be set to 600 to 700 nm.

Thus, this is suitable for optical transmission using a plastic optical fiber (POF) having the minimum transmission loss in this wavelength range. In POF, for instance, the diameter of the core made of plastic is set to 980 μm, and the diameter of the cladding made of plastic is set to 1000 μm. In this case, the wavelength range of 650 to 670 nm, called the second window, is often used. In this wavelength range, the transmission loss is, for instance, 300 dB/km, and the transmissible distance can be set to 50 m.

Further, in the case where the light emitting layer of the laminated body 32a, 34a is made of $Al_xGa_{1-x}As$ (0≤x≤1) or GaAs, for instance, the wavelength range of emission light can be set to 700 to 900 nm.

Thus, this is suitable for optical transmission using a plastic cladding silica fiber (PCF) having the minimum transmission loss in this wavelength range. In PCF, for instance, the diameter of the core made of quartz glass is set to 230 μm, and the diameter of the cladding made of plastic is set to 300 μm. The transmission loss is, for instance, 6 dB at a wavelength of 800 nm. The transmissible distance is 1000 m or the like, which can be made longer than the transmissible distance of POF.

The conductivity type of the substrate can be any of p-type and n-type depending on the characteristics such as the wavelength range, optical output, and transmission rate. Hence, the light emitting device is required to support both types.

Figure 3A:
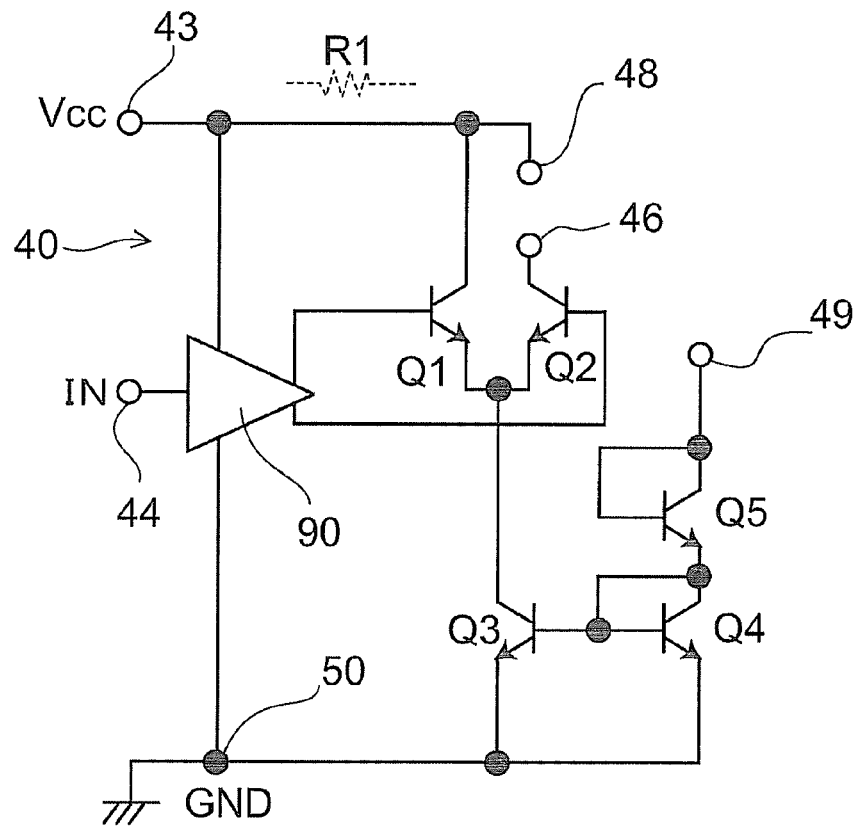
FIG. 3A is a circuit diagram of a driver IC used in an embodiment.
Figure 3B:
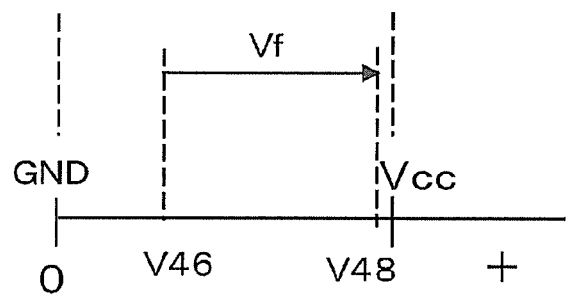
FIG. 3B shows the voltage range thereof.

FIG. 3A is a circuit diagram of the driver IC. FIG. 3B shows the voltage range of the first and second pads.

As shown in FIG. 3A, the driver IC 40 includes a power supply voltage (Vcc) pad 43, an input pad 44, a first pad 48, a second pad 46, and a ground (GND) pad 50. For instance, in the case where the input pad 44 is inputted with a Low level signal, the amplifier 90 turns on the transistor Q1 and turns off the transistor Q2, so that the light emitting device can be switched off. On the other hand, in the case where the input pad 44 is inputted with a High level signal, the transistor Q1 is turned off, and the transistor Q2 is turned on, so that the light emitting device can be switched on. That is, depending on the level of the input signal, the current is switched to one of the transistors Q1 and Q2 and supplied to the transistor Q3.

The transistors Q4 and Q5 have base-collector connections and operate as diodes. By the voltage applied to the terminal 49, the transistors Q4 and Q5 can control the driving current of the light emitting device. It is noted that the light emitting device may be turned on in response to input of a Low level signal, and the light emitting device may be turned off in response to input of a High level signal. Furthermore, the circuit of the driver IC 40 is not limited to FIG. 3A.

In the case where Vcc is positive, the n-side electrode of the light emitting device is connected to the second pad 46. The p-side electrode of the light emitting device is connected to the first pad 48, or directly to the power supply voltage lead 14. As a result, as shown in FIG. 3B, the first pad 48 can supply a voltage V48 on the power supply voltage side to the light emitting device, and the second pad 46 can supply a voltage V46 on the ground side to the light emitting device. On the other hand, in the case where Vcc is negative, the p-side electrode of the light emitting device is connected to the second pad 46. The n-side electrode of the light emitting device is connected to the first pad 48, or directly to the power supply voltage lead 14.

Figure 4A:
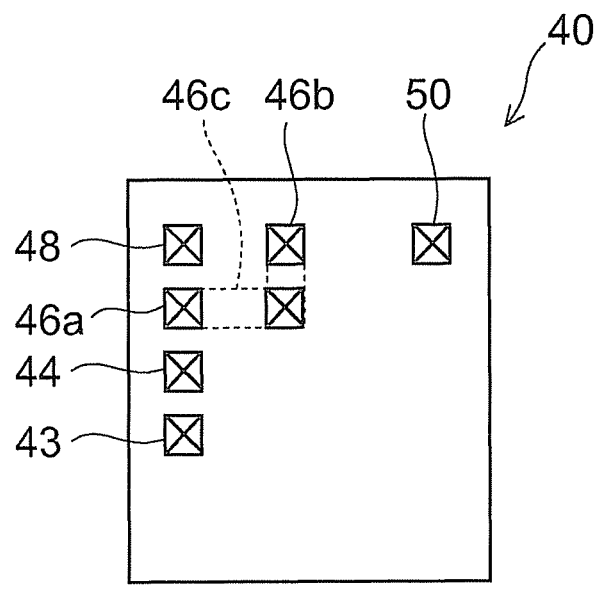
FIG. 4A is a schematic plan view showing the pad layout of the driver IC used in the embodiment.
Figure 4B:
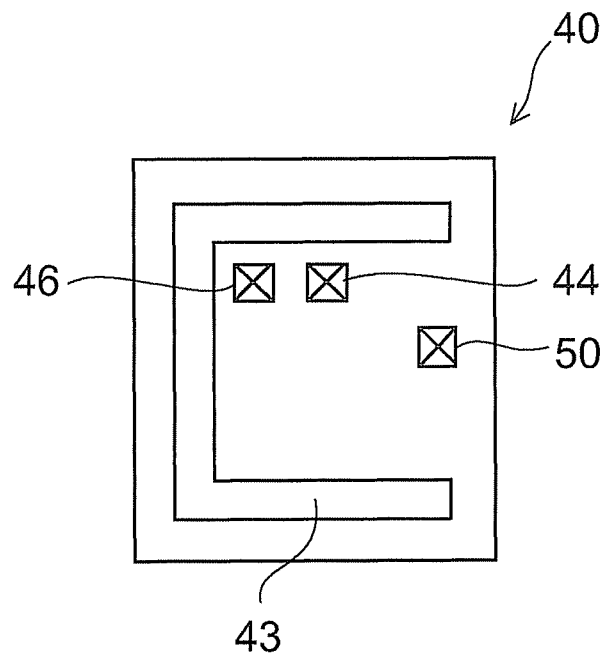
FIG. 4B is a schematic plan view of a variation thereof.

FIG. 4A is a schematic plan view showing the pad layout of the driver IC of this embodiment, and FIG. 4B is a schematic plan view of a variation thereof.

In FIG. 4A, on the upper surface of the driver IC 40, a Vcc pad 43, an input pad 44, second pads 46a and 46b, a first pad 48, and a GND pad 50 are provided. In the process of assembling an optical module, high volume productivity and reliability can be ensured by using a ball bonding method. In the ball bonding method, ball bonding is performed between the pads and an Au wire while applying ultrasonic vibration to the Au wire having a ball-shaped tip. The size of the pad can be set to, for instance, 80 to 120 μm on a side. The second pad 46 may include pads 46a and 46b connected by a wiring layer 46c. Furthermore, the Vcc pad 43 may be connected to the first pad 48 through a wiring layer, a resistor (R1 shown by the dashed line in FIG. 3A), and the like.

If the driver IC 40 is formed on the n-type substrate, the rear surface of the chip can be connected to GND without the GND pad 50. In the case where the power supply voltage Vcc applied to the driver IC 40 is a negative voltage, it is only necessary to reverse the conductivity type of Q1, Q2, Q3, Q4, and Q5 in the circuit of FIG. 3A.

Here, as in the variation of FIG. 4B, the planar pattern of the Vcc pad 43 may be bent so that the second pad 46 and the input pad 44 are surrounded by the Vcc pad 43.

Next, the connection of the leads to the driver IC 40 shown in FIG. 4A is described.

As shown in FIG. 1A, the Vcc pad 43 of the driver IC 40 is connected to the power supply voltage lead 14 by a bonding wire 70. The GND pad 50 of the driver IC 40 is connected to the ground lead 12 by a bonding wire 71. The input lead 16 is connected to the input pad 44 by a bonding wire 77.

In the case where the light emitting device 32 is mounted on the first lead 10, the first lead 10 is connected to the second pad 46a of the driver IC 40 by a bonding wire 72. The first electrode 35 of the light emitting device 32 serving as a p-side electrode is directly connected to the power supply voltage lead 14 by a bonding wire 73. The first pad 48 on the driver IC 40 is connected to the Vcc pad 43 inside the driver IC 40. Here, the first electrode 35 can also be supplied with the voltage V48 on the power supply side from the first pad 48 through the second lead 18. In the case where wire bonding is performed on the leads and the like from the pads of the driver IC 40, wires have various directions as shown in FIGS. 1A to 1C. For rapid and reliable connection while suppressing mechanical impact between the pads on the chip and the bonding wire, it is preferable to use the ball bonding method with an Au thin wire. In this case, the ball is not formed in the second round of bonding, and hence the bonding strength may be insufficient. Thus, preferably, the second round of bonding is performed on, for instance, a metal bonding pad having a large thickness and area to increase the bonding strength. This facilitates increasing the productivity of the assembling process and improving the product yield.

In FIG. 1B, the Vcc pad 43 of the driver IC 40 is connected to the power supply voltage lead 14 by a bonding wire 70. The GND pad 50 of the driver IC 40 is connected to the ground lead 12 by a bonding wire 71. The input lead 16 is connected to the input pad 44 by a bonding wire 77.

In the case where the second electrode 38 of the light emitting device 34 is bonded to the first lead 10 with metal solder or conductive adhesive, the first lead 10 is connected to the first pad 48 by a bonding wire 74. Here, the light emitting device 34 can be supplied with a voltage also by directly connecting the first lead 10 to the power supply voltage lead 14. The first electrode 37 of the light emitting device 34 is connected to the second lead 18 by a bonding wire 75. The second lead 18 is connected to the second pad 46*b* by a bonding wire 76. The second pad 46*b* is connected to the second pad 46*a* by a wiring layer 46*c*. The first electrode 37 of the light emitting device 34 and the second pads 46*a* and 46*b* are both provided on the upper surface of the respective chips. If the first electrode 37 is connected to the second pad 46*b* directly by a bonding wire, the bonding strength may be insufficient, and the assembly time is lengthened. That is, it is difficult to ensure volume productivity and reliability. In contrast, in this embodiment, the first electrode 37 is connected to the second pad 46*b* indirectly through the second lead 18 and the bonding wires 75 and 76. Hence, volume productivity and reliability can be ensured.

Figure 5A:
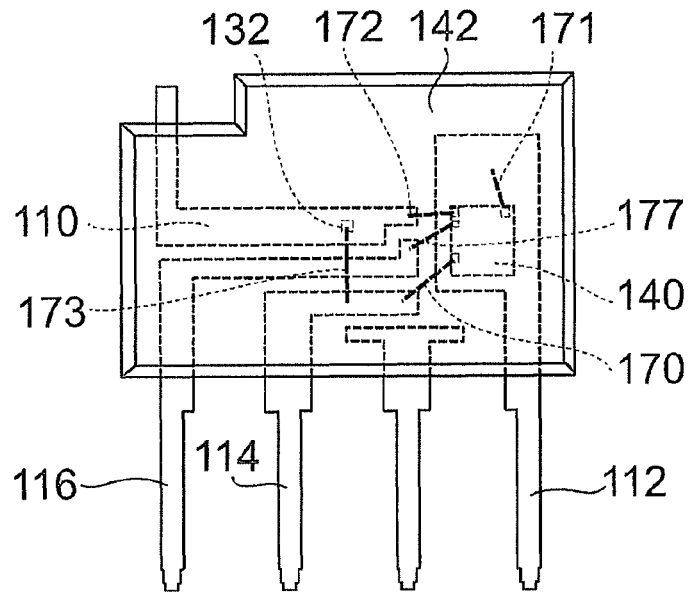
FIG. 5A is a schematic plan view of an optical module of a comparative example using a light emitting device provided on an n-type substrate.
Figure 5B:
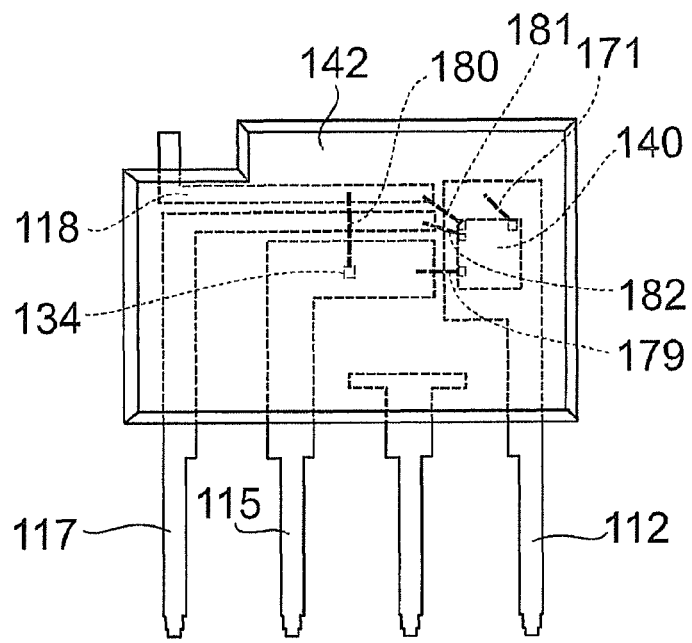
FIG. 5B is a schematic plan view of an optical module of the comparative example using a light emitting device provided on a p-type substrate.

FIG. 5A is a schematic plan view of an optical module of a comparative example using a light emitting device provided on an n-type substrate. FIG. 5B is a schematic plan view of an optical module of a comparative example using a light emitting device provided on a p-type substrate.

In FIG. 5A, the leads include a first lead 110 with the light emitting device 132 mounted thereon, a ground lead 112 with the driver IC 140 mounted thereon, a power supply voltage lead 114, and an input lead 116 to be inputted with signals. The transparent resin molding 142 covers the light emitting device 132, the driver IC 140, and one end portion of each lead.

Figure 6:
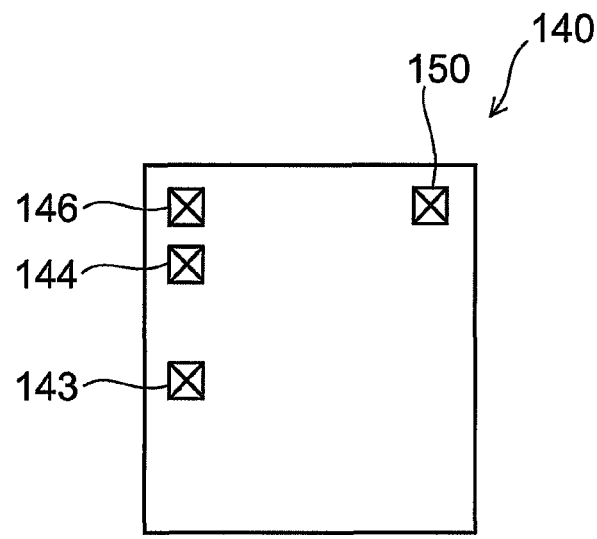
FIG. 6 is a schematic plan view showing the pad layout of a driver IC of the comparative example.

FIG. 6 is a schematic plan view showing the pad layout of the driver IC of the comparative example.

The driver IC 140 includes a Vcc pad 143, an input pad 144, a cathode pad 146, and a GND pad 150. The driver IC 140 can drive the light emitting device 132, 134 under a prescribed condition.

In FIG. 5A, the Vcc pad 143 of the driver IC 140 is connected to the power supply voltage lead 114 by a bonding wire 170. The GND pad 150 of the driver IC 140 is connected to the ground lead 112 by a bonding wire 171. The input lead 116 is connected to the input pad 144 by a bonding wire 177.

In the case where the light emitting device 132 is bonded onto the first lead 110, the first lead 110 is connected to the cathode pad 146 of the driver IC 140 by a bonding wire 172. The first electrode of the light emitting device 132 serving as a p-side electrode is connected to the power supply voltage lead 114 by a bonding wire 173.

In FIG. 5B, in the case where the light emitting device 134 is mounted on the power supply voltage lead 115, the power supply voltage lead 115 is connected to the Vcc pad 143 by a bonding wire 179. The first electrode of the light emitting device 134 is connected to the second lead 118 by a bonding wire 180. The second lead 118 is connected to the cathode pad 146 by a bonding wire 181. The input lead 117 is connected to the input pad 144 by a bonding wire 182. That is, in the comparative example, different lead frames are used for different conductivity types of the substrate of the light emitting device. This increases the number of models of the lead frame. Furthermore, the number of molds for the molding, lead cutting process, and the like increases, and the number of necessary jigs also increases. Thus, the productivity decreases. In addition, for different lead frames, the pad layout of the driver IC is often changed to prepare different driver ICs.

In contrast, in the first embodiment, for different conductivity types of the substrate of the light emitting device, a common lead frame can be used by changing connections among the first lead 10, the second lead 18, and the pads of the driver IC 40. Furthermore, it is also possible to use a common driver IC. That is, the types of packaging members are reduced, and the production process can be streamlined. For instance, POF and PCF optical modules can be produced by using a common assembly line and simply changing the program for wire bonding. Commonality of molds for molding and lead cutting can also be achieved. Consequently, price reduction is facilitated.

Figure 7:
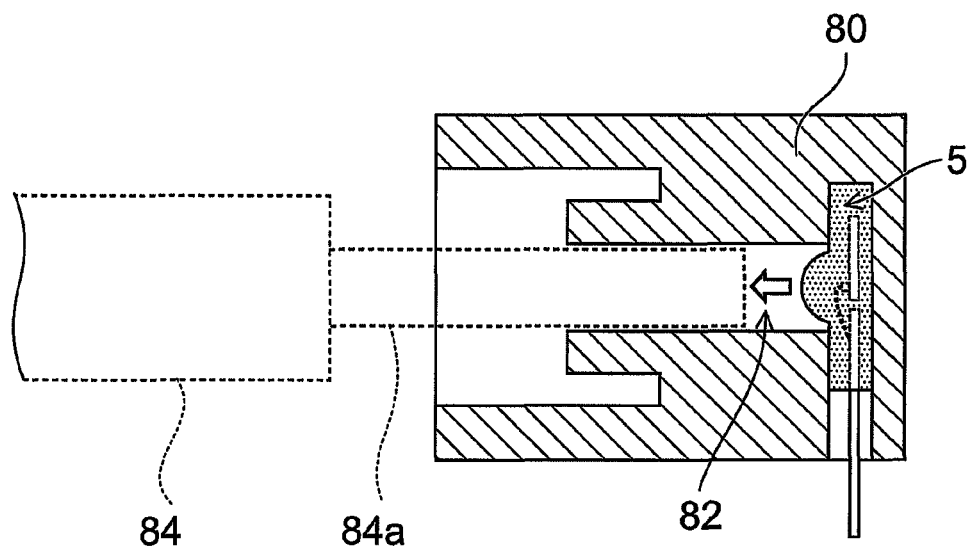
FIG. 7 is a schematic cross-sectional view of an optical transmitter using the optical module of the first embodiment.

FIG. 7 is a schematic cross-sectional view of an optical transmitter using the optical module of the first embodiment.

The optical transmitter includes an optical module 5, and a molding 80 made of resin. The molding 80 is provided with a ferrule guide portion 82 where a ferrule 84*a* at the tip of an optical fiber 84 can be inserted, and an opening portion where the optical module 5 can be inserted. Such an optical transmitter is called the receptacle type. Emission light from the light emitting device is incident from the ferrule 84*a* and travels in the POF or PCF optical fiber 84. This enables signal transmission for wide applications such as data transmission between information equipments, data transmission between industrial equipments, and connection between audio equipments. The signal transmission rate can be set in the range from DC to 500 Mbps, for instance.

Figures 8A, 8B:
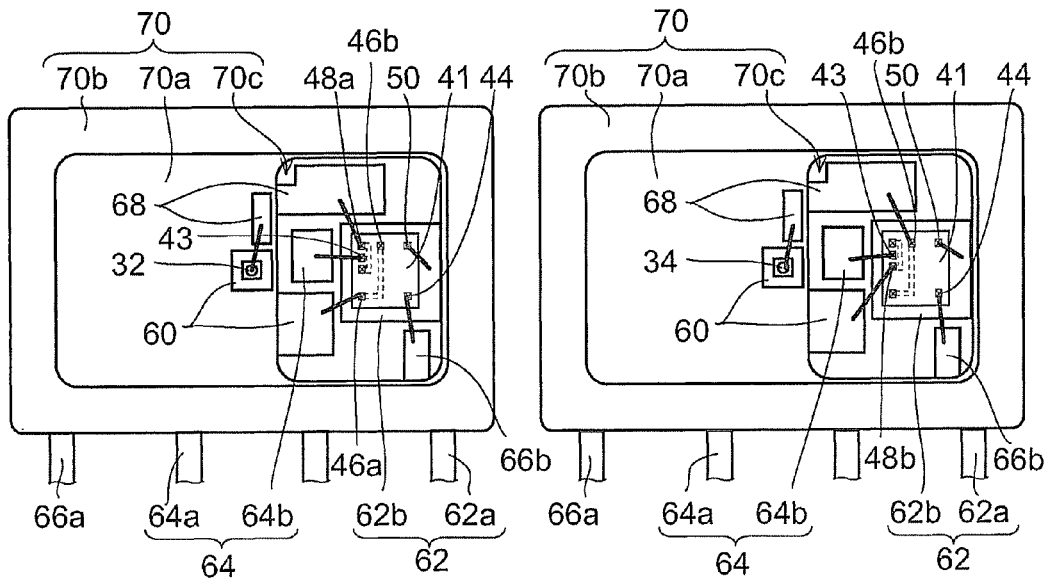
FIGS. 8A and 8B are schematic plan views inside an optical module according to a second embodiment.
Figure 8C:
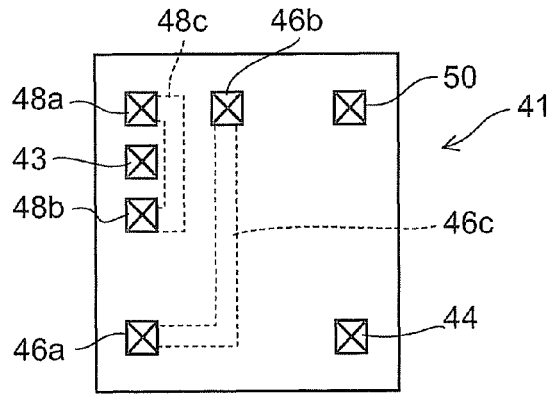
FIG. 8C is a schematic plan view of a driver IC.
Figure 8D:
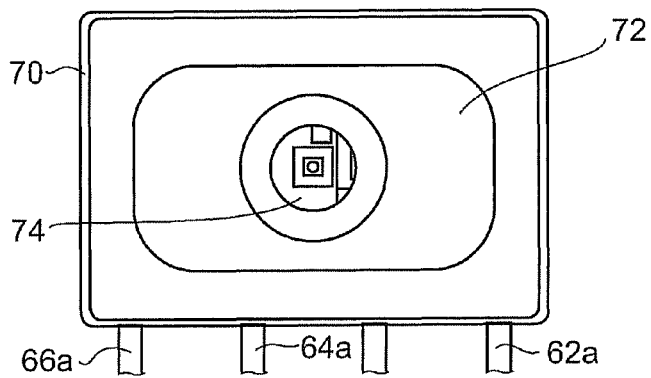
FIG. 8D is a schematic plan view of the sealed optical module.

FIGS. 8A and 8B are schematic plan views inside an optical module according to a second embodiment. FIG. 8C is a schematic plan view of a driver IC. FIG. 8D is a schematic plan view of the sealed optical module.

In FIG. 8A, the leads include a first lead 60 with the light emitting device 32 bonded thereto, a ground lead 62 with the driver IC 40 bonded thereto, a second lead 68 provided adjacent to the first lead 60 and the ground lead 62, a power supply voltage lead 64, and an input lead 66 to be inputted with signals. The support 70 for supporting these leads is made of ceramic. The ground lead 62, the power supply voltage lead 64, and the input lead 66 are bonded to the support 70, for instance, with silver brazing, or soldering material or by welding. Alternatively, the support 70 may be made of glass epoxy.

For instance, the support 70 made of ceramic includes a substrate 70*a* and a sealing portion 70*b*. The substrate 70*a* is provided with a recess 70*c*. In FIGS. 8A and 8B, the recess 70*c* is a through hole region provided in the substrate 70*a*.

On the surface of and inside the substrate 70*a*, a conductive portion made of thick film metallization and the like can be provided. Furthermore, the substrate 70*a* can be made of a laminated body in which a plurality of layers including conductive portions are laminated. The upper surface conductive portion provided on the substrate 70a can be connected to an outer lead through a conductive portion provided inside the substrate 70a.

For instance, the input lead 66 includes a lead frame portion (outer lead) 66a, an upper surface conductive portion 66b, and an internal conductive portion connecting therebetween. The power supply voltage lead 64 includes a lead frame portion (outer lead) 64a, an upper surface conductive portion 64b, and an internal conductive portion connecting therebetween. Furthermore, the ground lead 62 includes a lead frame portion (outer lead) 62a, an upper surface conductive portion 62b, and an internal conductive portion connecting therebetween. Here, the first lead 60 and the second lead 68 include no outer lead, and includes only an upper surface conductive portion.

If the light emitting device 32, 34 is provided on the upper surface of the substrate 70a and the driver IC 41 is provided on the bottom surface of the recess 70c, the configuration and packaging of the optical module are facilitated. In this case, the first lead 60 and the second lead 68 are provided on both the upper surface of the substrate 70a and the bottom surface of the recess 70c, but can be easily connected by conductive portions.

In FIG. 8A, the light emitting device 32 including an n-type substrate is bonded onto the first lead 60 with conductive adhesive, metal solder, or the like. The driver IC 41 is bonded onto the upper surface conductive portion 62b of the ground lead 62 with conductive adhesive or metal solder. The first electrode of the light emitting device 32 is a p-side electrode and connected to the first pad 48a of the driver IC 41 through the second lead 68. Here, if the first electrode is connected to the power supply voltage lead 64b, there is no need to use the second lead 68. The first lead 60 is connected to the second pad 46a.

In FIG. 8B, the light emitting device 34 including a p-type substrate is bonded onto the first lead 60 with conductive adhesive, metal solder, or the like. The first electrode of the light emitting device 34 is an n-side electrode and connected to the second pad 46b of the driver IC 41 through the second lead 68. The first lead 60 is connected to the first pad 48b. Here, the first lead 60 may be connected to the power supply voltage lead 64b.

The pad layout of the driver IC 41 in the second embodiment shown in FIG. 8C is a variation of that of the first embodiment. The first pads 48a and 48b are, for instance, internally connected by a wiring layer 48c. The first pads 48a and 48b may be internally connected to the Vcc pad 43 through a wiring layer, a resistor, and the like. The second pads 46a and 46b are, for instance, internally connected by a wiring layer 46c. Then, similarly to the first embodiment, for different substrate conductivity types of the light emitting device, common packaging members including the package, the driver IC, and the like can be used by simply changing the position of the bonding wires.

Furthermore, the sealing portion 70b of the support 70 can be bonded to a lid portion made of a metal shell 72 by the welding method or the like to hermetically seal the inside. Here, the metal shell 72 includes a transparent window portion 74 through which emission light from the light emitting device 32, 34 can be passed outside. Furthermore, a converging lens can be used for the window portion 74 to facilitate increasing the optical output. The hermetically sealed optical module can keep high reliability even in severe environments such as wide temperate range and high humidity, and can be widely used for factory automation equipment.

According to the first and second embodiments, through commonality of packaging members, optical modules capable of data transmission using POF and PCF can be provided with high volume productivity. Consequently, the price of the optical transmission system can be reduced. Such optical modules can be widely used for data transmission between information equipments, data transmission between industrial equipments, connection between audio equipments, communication in trunk lines and branch lines.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. An optical module comprising:
   a light emitting device including a substrate, a laminated body including a light emitting layer and provided on the substrate, a second electrode provided on a surface of the substrate, and a first electrode provided on the laminated body;
   a first lead to which the second electrode of the light emitting device is bonded;
   a ground lead;
   a second lead provided adjacent to the first lead and the ground lead;
   a driver IC including a power supply voltage pad, a first pad, a second pad having a first region and a second region, an input pad, and a ground pad, both of the first pad and the first region of the second pad being arranged to a same side of the first lead, the second region of the second pad being arranged to a side of the second lead;
   an input lead connected to the input pad; and
   a power supply voltage lead,
   the second electrode being connected to the first region of the second pad through the first lead,
   the first electrode being connected to the power supply voltage lead with a bonding wire,
   the first lead being provided between the second lead and the power supply voltage lead.
2. The optical module according to claim 1, further comprising:
   a resin molding covering the light emitting device, the driver IC, the first lead, the second lead, one end portion of the ground lead, one end portion of the input lead, and one end portion of the power supply voltage lead.
3. The optical module according to claim 1, further comprising:
   a support supporting the first lead, the second lead, the ground lead, the input lead, and the power supply voltage lead; and
   a lid portion bonded to the support and including a window portion capable of passing emission light from the light emitting device to outside.
4. The optical module according to claim 3, wherein the support is made of ceramic or glass epoxy.
5. The optical module according to claim 4, wherein the window portion is a converging lens.
6. The optical module according to claim 3, wherein the first lead, the second lead, the input lead, and the power supply voltage lead each include a conductive portion provided on the support and a lead frame portion.

7. The optical module according to claim 1, wherein the second pad includes two regions coupled by a wiring layer inside the driver IC.

8. The optical module according to claim 1, wherein the first pad is connected to the power supply voltage pad by a wiring layer inside the driver IC.

9. The optical module according to claim 1, wherein the driver IC turns on the light emitting device when the pulse signal is at one of a high level and a low level, and the driver IC turns off the light emitting device when the pulse signal is at one other of the high level and the low level.

10. The optical module according to claim 1, wherein the light emitting layer includes one of $In_x(Al_yGa_{1-y})_{1-x}P$ ($0 \leq x \leq 1$, $0 \leq y \leq 1$), $Al_xGa_{1-x}As$ ($0 \leq x \leq 1$), and GaAs.

11. An optical module comprising:
a light emitting device including a substrate, a laminated body including a light emitting layer and provided on the substrate, a second electrode provided on a surface of the substrate, and a first electrode provided on the laminated body;
a first lead to which the second electrode of the light emitting device is bonded;
a ground lead;
a second lead provided adjacent to the first lead and the ground lead;
a driver IC including a power supply voltage pad, a first pad, a second pad having a first region and a second region, an input pad, and a ground pad, both of the first pad and the first region of the second pad being arranged to a same side of the first lead, the second region of the second pad being arranged to a side of the second lead;
an input lead connected to the input pad; and
a power supply voltage lead,
the first electrode being connected to the second region of the second pad through the second lead,
the second electrode being connected to the power supply voltage lead through the first lead,
the first lead being provided between the second lead and the power supply voltage lead.

12. The optical module according to claim 11, further comprising:
a resin molding covering the light emitting device, the driver IC, the first lead, the second lead, one end portion of the ground lead, one end portion of the input lead, and one end portion of the power supply voltage lead.

13. The optical module according to claim 11, further comprising:
a support supporting the first lead, the second lead, the ground lead, the input lead, and the power supply voltage lead; and
a lid portion bonded to the support and including a window portion capable of passing emission light from the light emitting device to outside.

14. The optical module according to claim 13, wherein the support is made of ceramic or glass epoxy.

15. The optical module according to claim 14, wherein the window portion is a converging lens.

16. The optical module according to claim 13, wherein the first lead, the second lead, the input lead, and the power supply voltage lead each include a conductive portion provided on the support and a lead frame portion.

17. The optical module according to claim 11, wherein the second pad includes two regions coupled by a wiring layer inside the driver IC.

18. The optical module according to claim 11, wherein the first pad is connected to the power supply voltage pad by a wiring layer inside the driver IC.

19. The optical module according to claim 11, wherein the driver IC turns on the light emitting device when the pulse signal is at one of a high level and a low level, and the driver IC turns off the light emitting device when the pulse signal is at one other of the high level and the low level.

20. The optical module according to claim 1, wherein the light emitting layer includes one of $In_x(Al_yGa_{1-y})_{1-x}P$ ($0 \leq x \leq 1$, $0 \leq y \leq 1$), $Al_xGa_{1-x}As$ ($0 \leq x \leq 1$), and GaAs.

* * * * *